United States Patent
Bauer et al.

(10) Patent No.: US 9,647,196 B2
(45) Date of Patent: May 9, 2017

(54) WAFER-LEVEL PACKAGE AND METHOD FOR PRODUCTION THEREOF

(75) Inventors: Christian Bauer, Munich (DE); Hans Krueger, Munich (DE); Juergen Portmann, Munich (DE); Alois Stelzl, Munich (DE); Wolfgang Pahl, Munich (DE); Robert Koch, Munich (DE)

(73) Assignee: SNAPTRACK, INC., San Diego, CA (US)

( * ) Notice: Subject to any disclaimer, the term of this patent is extended or adjusted under 35 U.S.C. 154(b) by 657 days.

(21) Appl. No.: 14/007,074

(22) PCT Filed: Mar. 28, 2012

(86) PCT No.: PCT/EP2012/055559
§ 371 (c)(1),
(2), (4) Date: Dec. 9, 2013

(87) PCT Pub. No.: WO2012/136544
PCT Pub. Date: Oct. 11, 2012

(65) Prior Publication Data
US 2014/0111062 A1    Apr. 24, 2014

(30) Foreign Application Priority Data
Apr. 8, 2011 (DE) .......... 10 2011 016 554

(51) Int. Cl.
*H01L 41/053* (2006.01)
*B81C 1/00* (2006.01)
(Continued)

(52) U.S. Cl.
CPC ........ *H01L 41/053* (2013.01); *B81C 1/00301* (2013.01); *H01L 24/11* (2013.01);
(Continued)

(58) Field of Classification Search
CPC ........................ H03H 9/1021; H03H 9/1014
(Continued)

(56) References Cited

U.S. PATENT DOCUMENTS

| 6,734,601 | B2 * | 5/2004 | Taga | ............... H03H 9/059 310/313 R |
| 7,042,056 | B2 * | 5/2006 | Koshido | ............... H03H 3/08 257/414 |

(Continued)

FOREIGN PATENT DOCUMENTS

| CN | 1205809 A | 1/1999 |
| CN | 1977450 A | 6/2007 |

(Continued)

OTHER PUBLICATIONS

"Nickel," Wikipedia Encyclopedia, downloaded from: http://de.wikipedia.org/wiki/Nickel, Apr. 30, 2012, 16 pages.
(Continued)

*Primary Examiner* — Shawki S Ismail
*Assistant Examiner* — Bryan Gordon

(57) ABSTRACT

A hermetic wafer-level package composed of two piezoelectric wafers, preferably identical in terms of material, and a production method therefor are presented. The electrical and mechanical connection between the two wafers is accomplished with frame structures and pillars, the partial structures of which, distributed between two wafers, are wafer-bonded with the aid of connecting layers.

15 Claims, 8 Drawing Sheets

(51) Int. Cl.
 *H03H 9/10* (2006.01)
 *H01L 41/25* (2013.01)
 *H01L 23/00* (2006.01)
(52) U.S. Cl.
 CPC ........... *H01L 41/25* (2013.01); *H03H 9/1071* (2013.01); *B81B 2207/095* (2013.01); *H01L 2224/1134* (2013.01); *H01L 2924/01322* (2013.01); *H01L 2924/12042* (2013.01); *H01L 2924/1461* (2013.01); *Y10T 29/42* (2015.01)
(58) Field of Classification Search
 USPC .................... 310/313 R, 344, 348, 363, 364
 See application file for complete search history.

(56) References Cited

U.S. PATENT DOCUMENTS

| | | | | |
|---|---|---|---|---|
| 7,459,829 | B2* | 12/2008 | Aoki | H03H 3/08 310/313 B |
| 8,294,535 | B2 | 10/2012 | Feiertag et al. | |
| 8,404,516 | B2 | 3/2013 | Bauer et al. | |
| 2001/0010444 | A1 | 8/2001 | Pahl et al. | |
| 2003/0012693 | A1* | 1/2003 | Otillar | B01J 19/0046 506/39 |
| 2003/0151329 | A1* | 8/2003 | Kadota | H03H 9/02559 310/313 A |
| 2004/0032012 | A1* | 2/2004 | Wong | H01L 21/50 257/678 |
| 2006/0131731 | A1 | 6/2006 | Sato | |
| 2006/0202781 | A1* | 9/2006 | Pahl | H03H 9/02866 333/193 |
| 2007/0115079 | A1 | 5/2007 | Kubo et al. | |
| 2009/0224851 | A1* | 9/2009 | Feiertag | H03H 9/059 333/186 |
| 2009/0297785 | A1* | 12/2009 | Ueda | H01L 24/97 428/172 |
| 2010/0148285 | A1 | 6/2010 | Bauer et al. | |
| 2010/0277037 | A1* | 11/2010 | Fukano | H03H 9/059 310/313 C |
| 2011/0266917 | A1* | 11/2011 | Metzger | H03H 3/02 310/313 A |
| 2012/0049978 | A1* | 3/2012 | Pang | H03H 9/0571 333/189 |

FOREIGN PATENT DOCUMENTS

| | | |
|---|---|---|
| DE | 10217747 A1 | 6/2003 |
| DE | 102005026243 A1 | 12/2006 |
| DE | 102007025992 A1 | 12/2008 |
| DE | 102007028288 A1 | 12/2008 |
| JP | 2008-113178 A | 5/2008 |
| JP | 2008-187561 A | 8/2008 |
| JP | 2008546207 A | 12/2008 |
| JP | 2010528881 A | 8/2010 |
| KR | 20070020563 A | 2/2007 |

OTHER PUBLICATIONS

"Akustische-Oberflachenwellen-Filter," Wikipedia Encyclopedia, downloaded from: http://de.wikipedia.org/wiki/Oberfl%C3%A4chenwellenfilter, Apr. 30, 2012, 6 pages.

"The Prismark Wireless Technology Report; A Quarterly Market and Technology Analysis of RF Wireless Systems, Modules and Components from 100MHz to 100GHz," Prismark Partners, LLC, Sep. 2010, 48 pages.

* cited by examiner

WAFER-LEVEL PACKAGE AND METHOD FOR PRODUCTION THEREOF

This patent application is a national phase filing under section 371 of PCT/EP2012/055559, filed Mar. 28, 2012, which claims the priority of German patent application 10 2011 016 554.1, filed Apr. 8, 2011, each of which is incorporated herein by reference in its entirety.

BACKGROUND

MEMS (Micro Electro Mechanical System) components and, in particular, components operating with acoustic waves, have component structures that are sensitive to mechanical impairment. Such components usually require a package having a cavity, in which the component structures are securely protected against mechanical influences.

Components are known in which the component structures are protected between two mechanically stable substrates, such as can be obtained for example, by the flip-chip arrangement of the components on suitable carrier substrates.

In order to simplify the production of MEMS components, it is endeavored to produce the components more rapidly and more cost-effectively with the aid of a wafer-level package. U.S. Patent Publication No. 2009/0224851 discloses a wafer-level package for an SAW component (SAW=Surface Acoustic Wave), wherein a first wafer having first component structures is covered with a second wafer having second component structures with the aid of spacer structures such that both component structures are enclosed in a cavity between the two wafers. A polymer frame that encloses the component structures in a ring-like manner serves as spacer structure.

Electrical contacts between first and second component structures are performed within the cavity by means of pillar-type connections. The electrical connections of the component structures are led horizontally out of the cavity toward the outside onto one of the main surfaces of the wafer-level package. The method can be conducted such that two wafers each having a multiplicity of first and respectively second component structures can be prefabricated and connected to one another as a whole.

However, this known wafer-level package does not comply with modern requirements made of miniaturized MEMS components and in particular components operating with acoustic waves and has, in particular, deficiencies with regard to the hermeticity of the cavity, with regard to the required method outlay for 3D interconnects and the miniaturization to be achieved.

SUMMARY OF THE INVENTION

Embodiments of the present invention specify a wafer-level package for MEMS components which is improved in at least one of the indicated points in comparison with the known wafer-level package mentioned above.

A wafer-level package for an electrical component is proposed. A hermetically sealed cavity is enclosed between a first and a second piezoelectric wafer and a metallic frame structure arranged between the wafers. At least the first component structures on the first piezoelectric wafer are arranged in the cavity. The second piezoelectric wafer likewise carries component structures, which can be arranged in the cavity, on the opposite surface of the second wafer or on both surfaces of the second wafer.

A wafer within the meaning of the invention is understood to be a preferably monocrystalline substrate on which either in each case a multiplicity of component structures which implement a plurality of components are realized alongside one another, or on which component structures for exactly one component or one package are realized, which, however, has been processed as a large-area substrate and singulated later to form individual components.

In a further configuration explained in greater detail later, a wafer is also understood to be a first wafer-level package composed of a first and a further wafer, which together with the second wafer then forms the actual (second) wafer-level package, which thus comprises a stack of three or more individual wafers connected to one another.

The metallic frame structure is seated on both mutually facing surfaces of first wafer and second wafer and is thus hermetically connected thereto. The electrical connections of the component comprising first and second component structures are provided on that surface of the second wafer which faces away from the cavity.

Pillars are arranged within the enclosed cavity, said pillars constituting pillar-type electrical connections between first and second component structures or between first and second wafers and being supported on the mutually facing surfaces of the two wafers. They are electrically conductively connected to first and/or second component structures. It is also possible to provide additional pillar-type structures, which are likewise supported on the mutually facing surfaces of the two wafers, to which only a mechanically supporting functions is accorded, and which can improve the mechanical stability of the component.

Within the cavity, on the inwardly facing surfaces of first wafer and second wafer there are arranged contact pads connected to the respective component structures on the same surface. Plated through-holes are led through the second wafer, and end between the wafers either on the frame structure, on a pillar or on one of the contact pads mentioned, without the hermetically sealed cavity thereby being opened. The plated through-holes thus connect, by means of the pillars or the contact pads, electrical connections on the top side of the second wafer to first and second component structures in the interior of the cavity. The frame structure and pillars substantially consist of copper, while the contact pads at least comprise copper.

First and second piezoelectric wafers are adapted to one another in terms of their thermal expansion behavior or have an identical expansion behavior. Accordingly, preferably two material-identical wafers are used as first and second wafers for the wafer-level package. Further possible combinations consist in wafers composed of lithium tantalate, lithium niobate and quartz, which exhibit approximately the same thermal expansion behavior. It is thus possible, even when relatively high process temperatures are used, to obtain a package which has low stress after cooling and in which the component has electrical properties which can be reproduced well and improved mechanical properties.

The metallic frame structures enable a hermetic contact with the surfaces of the two wafers and among one another and thus a hermetically sealed closure of the cavity enclosed within the frame structure between the two wafers. The electrical connections of the component are arranged on one of the two outwardly facing main surfaces of the package and require no additional area. By virtue of providing component structures on a total of at least two surfaces of the two wafers, the component has a 3D integration whose base area is reduced in comparison with a wafer-level package having only one plane of component structures.

The redistribution wiring, that is to say the routing of the electrical connections from a surface of one of the wafers to an outer surface, is effected exclusively via plated through-holes and is therefore not at the expense of the base area of the component, as is the case for instance with the wafer-level package known in the patent application cited above.

The use of copper for the frame structure and the pillars, which require a higher metallization thickness in comparison with the other component structures, enables a rapid construction of the structures in electrolytic or electroless deposition methods. Moreover, highly electrically conductive connections with reduced conduction resistance can be produced with copper.

Alongside copper, the metallizations can also comprise other (partial) layers with which, e.g., the copper surfaces can be provided.

In one embodiment, the first wafer has component structures operating with surface acoustic waves (SAW component structures) and is embodied, e.g., as a SAW filter. The component structures on the second wafer can likewise have transducers for surface acoustic waves and alternatively or furthermore also comprise additional passive components, e.g., inductances and capacitances.

All these component structures for transducers and the passive components mentioned can be realized with the aid of structured metallizations applied superficially. The metallizations can therefore be combined, in particular, and can be produced in common method steps. Therefore, the integration of passive components and SAW transducers within a component is possible in a cost-effective manner and leads to highly integrated components having designs reduced with regard to size.

In accordance with a further embodiment, the underside of the first wafer has a shielding layer, which covers the entire underside of the wafer and, if appropriate, parts of the side edges of first wafer and/or second wafer. Said shielding layer can bring about an electrical shielding and, given suitably chosen material of the shielding layer, also an electromagnetic shielding of the component structures and thus of the component. An electromagnetic shielding can comprise a magnetic material such as a nickel layer, for example. The shielding layer can comprise two or more partial layers composed of different metals, wherein a total thickness of the shielding layer even starting from 1 μm may be sufficient for specific requirements. The shielding layer can also be provided with an arbitrarily higher thickness of, for example, 40 μm or more. In all cases, it is necessary to weigh up shielding that can thus be achieved against the costs of production and in particular the increased method duration during layer production.

In a further embodiment, the wafer-level package has a damping layer for bulk waves on the outwardly facing underside of the first wafer. Various embodiments are suitable for this purpose.

Thus, it is possible to embody a so-called λ-quarter layer made from a suitable material and in particular a metal layer (e.g., silver). Dielectrics are also suitable for the λ-quarter layer. The thickness of this layer, as the name already suggests, is chosen at a quarter of the wavelength λ of that acoustic wave which is generated by the component structures, propagates into the wafer interior and is reflected in an undesirable manner at the wafer rear side. This acoustic wave is reflected at the front and rear sides of the λ-quarter layer in such a way that the two partial waves cancel each other out upon superimposition.

A further embodiment of the damping layer consists in providing an irregular pattern on the underside of the first wafer, the material of which allows the impinging acoustic waves to pass and then scatters them in the pattern. Thus, even scattered waves passing back into the component can no longer lead to undesirable signals. Preferably, the pattern comprises an acoustically well matched material, e.g., Cu, Cr or Ni for LT wafers or Ti for LN wafers.

Such a pattern is embodied in particular as a metal pattern and preferably as an irregular pattern of pillars. A metal that can be deposited and structured well can be used for this purpose.

In one embodiment, the structured metal pattern consists of nickel. The height of these pillars or the thickness of the damping layer is typically greater than 1 μm in this embodiment. Preferably, however, a maximum of reflective structures is made available, which can be obtained, for example, with a densest possible pattern of pillars, that is to say a maximum number of pillars per unit area. A pattern in which the average distance between two adjacent pillars approximately corresponds to the diameter of the pillars is preferred from the standpoint of method engineering.

The pillars can have an irregular distribution, irregular base areas or different sizes. Regular variations or arrangements should be avoided in all cases.

Preferably, the irregular pattern of elements that reflect surface waves is embedded into a matrix of a layer which has a different acoustic impedance than the pillars. Preferably, the pillars or metal structures are embedded into a polymer layer.

In one embodiment, on the underside of the first wafer there are arranged both an acoustic damping layer for bulk waves in the form of an irregular metallic pattern and directly thereover an electrical or electromagnetic shielding layer. The metal structures of the damping layer can be connected to the shielding layer.

In a further embodiment, measures are implemented for reducing the insertion loss of an SAW filter formed at least on the first wafer. The component structures of a SAW component comprise transducers for surface acoustic waves, wherein each transducer comprises two interdigitally intermeshed comb electrodes. In a comb electrode, the electrode fingers are connected to a busbar that supplies all the electrode fingers of a comb electrode with the same electrical potential. A plurality of transducers are suitably interconnected with one another by means of conductive pads having a good electrical contact with the busbars. Transducers and pads together form the SAW filter. The busbars and the pads have a significant proportion of the total electrical losses of the SAW filter and should therefore have the lowest possible electrical resistance. For this purpose, the busbars and the pads have heretofore been thickened with a further metal layer having a thickness of up to 1 μm in a separate lithographic fabrication step. In accordance with a newly proposed embodiment, the pads are produced together with the metallic frame, preferably from copper. These pads have a significantly lower resistance on account of the good conductivity of copper and the larger thickness compared with the previous pad thickening. This advantageously reduces the number of required process steps whilst at the same time improving the conductivity of the pads.

Preferably, the busbars and/or pads are fabricated in conventional metallization and provided with a thickening in the form of a copper layer and therefore have a higher metallization height than the electrode fingers and the other component structures.

In one embodiment, the thickening of the busbars and/or pads comprises a copper structure arranged in trenches on the surface of the substrate. With this embodiment, the higher total layer thickness can be wholly or partly compensated for by a corresponding dimensioning of the depth of the depression. In both cases, it is possible to fabricate busbars, pads and electrode fingers in the same method from conventional electrode material with a uniform layer thickness and to provide only the pads with increased current-carrying capacity with the aid of a copper layer arranged below or above the pads as thickening and thus to reduce the electrical resistance thereof.

However, it is also possible to use exclusively a copper layer for busbars and pads, which copper layer, despite the higher electrical conductivity compared with the in particular aluminum-comprising material used for the other electrode structures, can be embodied with a higher thickness than the electrode structures (component structures). In the transition from a conventional transducer having a typical metallization thickness of approximately 0.9 μm on the basis of aluminum to a corresponding copper structure having a layer thickness increased to 2 μm, it is possible to achieve a reduction of the insertion loss in the passband of the filter of approximately 0.15 dB, as is evident from a simulation.

In a further advantageous configuration, a stress reduction layer comprising a polymer can be arranged between the top side of the 2nd wafer and the metallization for electrical connections and/or for component structures. The stress reduction layer can also run below conductor tracks, but preferably not below active component structures of components operating with acoustic waves such as GBAW components (GBAW=guided bulk acoustic wave) or SAW components, in order not to impair the acoustic function thereof.

Via the electrical connections, the wafer-level package can be electrically connected to a circuit environment, wherein the connection is effected by means of bumps, in particular. Since the circuit environment (e.g., the circuit board) has a thermal behavior that deviates from the MEMS component, high bump stresses can occur in the event of thermal cycling. The stress reduction layer can be used to compensate for these forces by corresponding compliance of the stress reduction layer, thereby reducing the risk of tearing away of the electrical connections or tearing away of the bump connection from the electrical connection. The stress reduction layer is therefore preferably structured and restricted to a surrounding region around the respective bump connection below the respective electrical connection.

The wafer-level package can comprise passive components on one of the two wafers and in particular copper coils arranged in the form of horizontal spirals on a surface of one of the two wafers or of both wafers, in particular on a surface of the second wafer. If the underside of the second wafer extending into the cavity has a sufficiently free area, then the copper coil can be arranged on this surface in the interior of the cavity. Since the copper coil does not require a cavity, in principle, it can also be arranged on an outwardly facing surface of the package, in particular on the outwardly facing top side of the second wafer. The passive components or the copper coils are part of the electrical component, and are therefore electrically conductively connected to the component structures and fulfill a partial function of the component. By way of example, an electrical matching of the component structures to the external circuit environment can be performed by means of the copper coil.

Between the copper coils and the wafer there is preferably arranged a polymer layer having a thickness of a few μm and having a low $\in$ for increasing the quality factor of the copper coils.

In one embodiment, all metallization elements connected both to first wafer and to second wafer, that is to say the frame structure and the pillars, as viewed over their entire height, have two sections having a different cross-sectional area, which are assigned in each case to one of two partial structures arranged on first wafer and second wafer, respectively. This has the advantage that firstly the alignment of first wafer and second wafer during joining together is simplified. Even in the case of inexact mutual alignment of first wafer and second wafer or first partial structure and second partial structure, the contact area of the partial structures touching one another remains constant provided that a possible misalignment of the partial structure having the smaller cross-sectional area remains within the limits of the larger cross-sectional area of the other partial structure. Thus, the contact area between two connected partial structures always corresponds to the smaller cross-sectional area of the respective pair of partial structures.

In one embodiment, the shielding layer is connected via a plated through-hole through the first wafer, at the inwardly facing surface thereof, to a pad, a pillar or the frame structure. Via one or a plurality of further plated through-holes through the second wafer, the structures mentioned are then electrically conductively connected to an electrical connection on the outwardly facing top side of the second wafer. Preferably, frame structure and shielding layer are connected to an electrical connection to be connected to ground on the top side.

The scope of the invention also includes a method for producing a wafer-level package which has advantages over known methods. The novel method comprises, in accordance with the independent method claim, at least the following steps. A first piezoelectric wafer has on its top side first component structures and a first frame partial structure. A second piezoelectric wafer has second component structures, which are arranged on the underside and/or on its top side and has second frame partial structures on its underside. The first wafer and second wafer are joined by the mutually corresponding frame partial structures of first wafer and second wafer. A wafer bonding method is carried out to produce a first wafer-level package with a hermetic connection between the frame partial structures. The two connected frame partial structures produce a frame structure that hermetically encloses a cavity between itself and the two wafers. Holes are drilled from the top side of the second wafer, wherein first and/or second component structures or the frame structure is exposed, and wherein a laser ablation method is used for drilling. The top side of the second wafer is metallized in order to produce a plated through-hole toward the first and second component structures and, if appropriate, toward the frame structure and in order to produce an electrical connection connected to the respective plated through-hole.

In a further configuration of the method, the first wafer-level package obtained after metallization is provided with frame partial structures instead of the electrical connections at its top side and is used as first wafer again in a method according to the steps described, wherein it is joined together with a second (but overall third) wafer to form a (second) wafer-level package.

In order to carry out the respective wafer bonding method, the two wafers can be joined together at an elevated temperature of, e.g., >150° C. and subsequently subjected to heat treatment at an even higher temperature.

First and second wafers are therefore connected by means of connection of two frame partial structures arranged on the mutually facing surfaces of first and second wafers. First and second frame partial structures correspond to one another geometrically, such that the frame partial structures can be connected with an accurate fit. In the case of one of the two frame partial structures, as already mentioned further above, a smaller contact area can be provided, such that the alignment can be effected with a certain tolerance, without a reduction of the contact area between first and second frame partial structures. When joining together first and second wafers, first and second partial structures of the pillars which are distributed between the two mutually facing surfaces of the two wafers are also connected to one another. The partial structures of the pillars are also arranged on the two surfaces in a mutually mirror-inverted manner and have, if appropriate, different cross-sectional areas.

With a laser ablation method, it is possible to drill holes for the later plated through-holes through one or both wafers with high accuracy. For the laser ablation method, ps lasers are available which can produce a multiplicity of holes at high speed. In this case, by means of a scanner, the laser beam can be guided with high beam quality ($TEM_{00}$) over the wafer and focused such that a conical cross section of the holes arises. Preferably, the outwardly facing opening then has a larger cross-sectional area than the inner opening.

A pulsed ps laser of suitable wavelength is preferably used. Suitable wavelengths for the ps laser are in the range of 500 to 600 nm or in the range of 250 to 400 nm.

Since the holes are produced only after the connection of the two wafers, this variant is designated by the applicant as "vias last." In this case, a Gaussian energy distribution in the laser beam ($TEM_{00}$ mode) is optimal in order to produce a hole having a cross section that tapers downward or with increasing depth. In one preferred embodiment, an edge inclination of the hole is set such that the diameter is halved from the upper entrance area as far as the exit area through the wafer and there is preferably in the region of half the thickness of the wafer.

With the aid of the plated through-holes, contacts are led to first or second component structures. The holes for the plated through-holes are therefore positioned such that the exit opening ends completely within a metallization on the lower surface of the second wafer. Pillars, frame structure and pads on the lower surface of the second wafer constitute metallization suitable for the through-plating. For a reliable alignment it is therefore necessary for the diameter of the exit opening of the hole to be less than the diameter of the metallization structure to be met in the region of the exit opening.

The mutual connection of frame partial structures and pillar partial structures on the two wafers is accomplished in a simple manner if an intermediate layer composed of nano-metal particles is applied on the corresponding contact areas of at least one wafer. These nanoparticles have the advantage that their melting point is considerably reduced compared with a solid material of the same metal, which can be attributed to the high ratio of surface area to volume in the nano-metal particles. The nano-metal particles can then be sintered together in a thermal treatment under relatively mild conditions, wherein they bond fixedly to the support, that is to say the metal surfaces of the corresponding partial structures. The nanostructure of the particles is lost during sintering together, and so the melting point of the sintered nanolayer at the contact area rises as a result. This ensures that despite a low sintering temperature, nevertheless a strong connection having high thermal stability is provided and the risk of later melting of this connection at elevated temperature is practically ruled out.

The nano-metal particles are selected from metals which firstly provide for a good connection to the copper-comprising contact areas of frame partial structures and pillar partial structures, and which secondly can be sintered at sufficiently low temperatures. Suitable metals for the nano-metal particles are, for example, silver, gold, copper and tin. However, aluminum, indium and metal alloys such as, e.g., eutectic gold/tin are also suitable.

While metallic silver has a melting point of 961° C., a sintering temperature of between 100° and 250° C. can be achieved with silver nano-metal particles depending on particle size. It is not ruled out that the sintering temperature can be lowered further by further optimization. The low sintering temperature that can be achieved has the consequence that a tight connection of the contact areas can already be achieved with a thermal treatment at relatively low temperatures, which in the present case (silver nano-metal particles) is in the range of between 100° and 250° C.

Simple application of the nano-metal particles is accomplished from a suspension that can be handled like a liquid. In order to prevent the nano-metal particles from agglomerating in the suspension, they are surrounded by a polymer sheath. For this purpose, it is preferred to choose a polymer that decomposes at the latest at the sintering temperature, such that the pure nano-metal particles are released, can sinter and produce the correspondingly impermeable intermediate layer.

Nano-metal particles are understood to be particles having a diameter in the nanometer range, for example 5 nm-100 nm, preferably less than 10 nm. Preferably, the nano-metal particles are in an alcoholic solution and in particular in a solution of a lower alkyl alcohol, which evaporates below or at the sintering temperature of the nano-metal particles.

The application of the nano-metal particles in the suspension can be effected by any method suitable for applying a liquid. Nano-metal particles can be sprayed on, printed, rolled on or applied by a jet printing method, in particular, as a suspension.

The jet printing method is preferred insofar as structures having structure sizes <10 µm can be obtained with the aid of this method without further structuring steps. Droplet diameters during the jet printing method of approximately 5 µm diameter are required for this purpose.

The small droplet diameters that can be achieved in the jet printing method also allow fine setting of the layer thickness of printed layers of nano-metal particles.

In order to achieve a hermetic connection of the two contact areas, with the jet printing method at least the unevennesses of the contact areas to be connected are eliminated, or a layer thickness corresponding to the maximum height of the unevennesses is applied. Over and above the roughness, only a small layer thickness measuring only a few particle diameters of the nano-metal particles is then required. In general, a layer thickness of the layer containing the nano-metal particles of approximately half a µm suffices.

Besides the coating of the contact areas of structures to be connected with the abovementioned nano-metal particles or solder metals, other connecting methods are, of course, also suitable in principle, in particular the direct wafer bonding method (Cu—Cu bonding). With the aid thereof, planar metal surfaces of suitable morphology can be connected to one another with mutual pressing together and setting of suitable temperatures. Thus, by way of example, copper-comprising contact areas can be directly connected to one another. One known method for producing intermetal connections such as Cu—Cu connections is also the thermosonic method.

The electrical connection of internal component structures or frame structures is effected by means of plated through-holes. Electrically conductive structures on the underside of the first wafer can also be connected to component structures or external connections in this way. Most of the holes for this are produced after the two wafers have been joined together, and are then drilled from the top side of the second wafer.

The laser ablation method used for the holes can be accelerated by reducing the thickness of the second wafer before the holes are drilled. This can be effected, for example, by grinding to a residual layer thickness which still enables sufficient stability of the individual component. The mechanical stability of the wafer assemblage is very high as a result of the wafer bonding method between two wafers which are thermally matched, and/or consist of identical wafer material, and the only low mechanical strains resulting therefrom, and as a result of supporting frames and pillars. Residual layer thicknesses of approximately 30 µm arise for components having a base area less than 1 $mm^2$ from the requirement that the components that arise upon the singulation of the wafer assemblage are intended to withstand a pressure of 10 MPa (100 bar) during overmolding in a later step of the packaging process, which is ensured in the case of this residual layer thickness.

During the drilling of the holes, the laser ablation method is conducted such that incipient drilling or opening of the cavity between the two wafers within the frame structure is reliably avoided. For this purpose, the holes are localized such that they end at the underside of the (upper) second wafer exclusively on metallic structures. This can be implemented with exact guidance of the laser treatment. Furthermore, the method must be stopped in a timely manner in order to avoid also removing the metal of the metallization too much or even opening the cavity at the bottom of the hole.

The depth monitoring during the laser ablation method can be supported by firstly choosing a selective removal method that increases the tolerance of the method. It is advantageous, however, to optically detect an end point. This is advantageously accomplished by observing a spectral line of the lifted-off material vapor. The end point of the method is reached either when a spectral line of the lifted-off wafer material vanishes or when a spectral line of the metal of the metallization, that is to say in particular that of copper or of the adhesion layer (Ti), occurs.

In one embodiment of the production method, the procedure comprises in the case of both wafers applying frame partial structures and supporting partial structures within the area enclosed by the frame partial structures on the corresponding surface or surfaces of the two wafers. In this case, it is preferred to produce frame partial structures and supporting partial structures in the same method step and from the same material, such that both have the same height. If method-dictated tolerances lead to different heights, or the planarity of the surfaces of the partial structures leaves something to be desired, the surface of the partial structures which constitute the contact areas to be connected in the wafer bonding method can be planarized by means of a planarization step. This is accomplished by means of a diamond milling method, for example. In this way, the contact areas then lie in a common plane and have planar surfaces having a roughness only in the nm range, which facilitate the connection of the contact areas.

Before the wafers are joined together, they have to be aligned relative to one another such that the contact areas to be connected have a desired or a maximum overlap region.

The mutual alignment can be facilitated by the base areas of the contact areas that are to be connected being chosen with different sizes. The maximum overlap area of two contact areas to be connected then corresponds to the base area of the partial structure having the smaller area. This maximum overlap is obtained whenever the alignment tolerance does not exceed the difference between the dimensions of the contact areas. All deviations within this tolerance then still lead to 100% overlap between the smaller contact area and the larger contact area.

Advantageously, those partial structures having the smaller contact area are applied on the top side of that wafer whose component structures have the largest area requirement. Conversely, the partial structures having the larger contact area are applied on the top side of that wafer which has more free wafer surface available on account of the smaller area requirement of its component structures. It is then possible to achieve a higher tolerance during joining together, without this necessitating an increased requirement of free wafer surface on the wafer having the smaller area reserves. By virtue of this measure, the area requirement of the component overall is also minimized.

The component structures can have metallizations of different types. In general, the metallizations of the component structures differ from those of the frame structure and the material of the pillars, which substantially comprises copper. It is possible, however, to produce the desired metallization heights of the component structures, of the frame structure and of the pillars additively by dividing the metallization process into a plurality of substeps. In substeps, identical materials, in particular copper layers, both for component structures and for frame structure and pillars can then be applied in parallel.

Preferably at least two-stage methods are chosen for producing the metallizations. In a first stage, a base layer is applied, which is subsequently reinforced electrolytically or in an electroless manner in a second stage.

A structured metallization can be obtained if, after the base layer has been applied, surfaces that are not to be metalized are covered with a structured photoresist layer. The electrolytic or electroless reinforcement then takes place exclusively in the regions of the base layer which are exposed because they are not covered by the photoresist layer.

One possibility for applying the base layer consists in a sputtering method that leads to a continuous and large-area base layer. However, it is also possible to apply the base layer by means of a structured method, for which purpose the abovementioned jet printing method is suitable, for example. This method, which is derived and therefore known from inkjet printing, can, by means of suitable nozzle diameters and thus with different droplet sizes, also be used to print large-area regions at sufficient speed. Conversely, structures down to a width of approximately 5 µm can be cleanly structured by the jet printing method.

A layer thickness of, for example, 0.2 µm of metal applied by sputtering suffices for a base layer that can be reinforced without any problems. The base layer can be, for example, titanium, titanium/copper or a silver, gold or copper layer produced from nano-metal particles.

In order to reinforce the base layer, one or else a plurality of electrolytic layers, for example, a layer sequence comprising copper and nickel thereover, can be applied over said base layer.

In one embodiment, one of the two wafers, preferably the second wafer, has on one or both surfaces in each case one or a plurality of electrically conductive layers which can be structured. With the aid of the plated through-holes, it is possible not only to lead electrical connections from one top side of a wafer to the other top side thereof, but also to interconnect one or a plurality of electrically conductive layers arranged one above another. Such layers, applied on both top sides of a wafer, can be separated from one another by insulating and in particular dielectric layers.

BRIEF DESCRIPTION OF THE DRAWINGS

The invention is explained in greater detail below on the basis of exemplary embodiments and associated figures. The figures have been drawn up schematically and not as true to scale, and so neither absolute sizes nor size relationships can be inferred from them.

DETAILED DESCRIPTION OF ILLUSTRATIVE EMBODIMENTS

Figure 1:
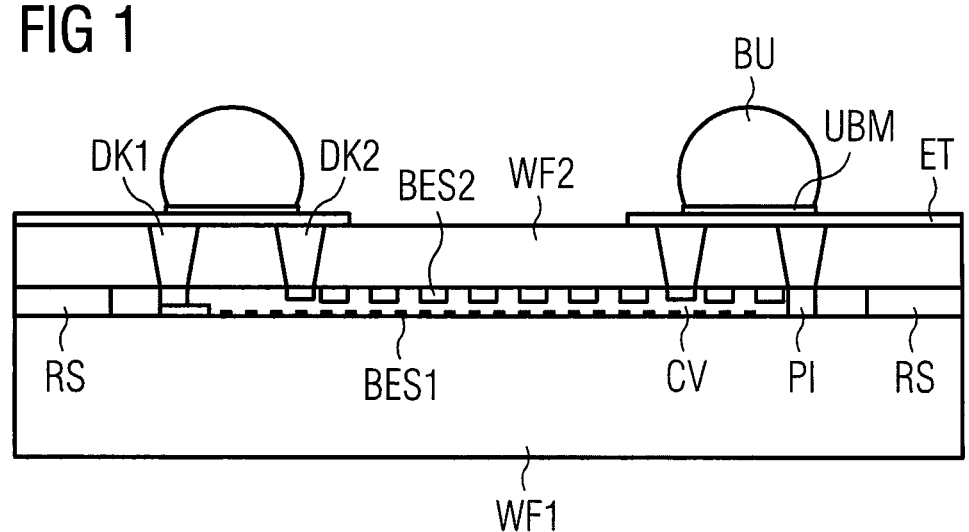
FIG. 1 shows a wafer-level package according to the invention in schematic cross section.

FIG. 1 shows a wafer-level package according to the invention in schematic cross section. A first wafer WF1 and a second wafer WF2 are connected to one another by means of structure elements—arranged therebetween—such as frame structures RS and pillars PI, by means of a wafer bonding method.

Component structures BES1, BES2 are arranged at least on the mutually facing top sides of the two wafers WF1, WF2. The frame structure encloses the component structures BES in a ring-shaped manner and has a sufficient height such that first and second component structures BES1, BES2 of the connected wafers remain spaced apart from one another.

A cavity CV is enclosed between the two wafers WF1, WF2 and the frame structure RS. First and second wafers are now mechanically and, if appropriate, also electrically connected to one another exclusively by means of the frame structure RS and the pillars PI.

The first component structures are preferably electrodes and transducers of a component operating with acoustic waves, wherein the first wafer WF1 is then a piezoelectric wafer.

The second component structures BES2 on the top side of the second wafer WF2 can likewise be electrodes and transducers of a component operating with acoustic waves. However, the second component structures BES2 can also constitute metallization structures of passive components such as, for example, inductances and capacitances. It is also possible for one of the two wafers to comprise MEMS components and to have the corresponding component structures.

In one embodiment, first wafer and second wafer are both piezoelectric and preferably composed of the same crystalline material and arranged relative to one another in the same orientation with regard to their crystal axes. The material of the first and second wafers WF1, WF2 can be selected, for example, from lithium tantalate LT, lithium niobate LN, quartz or some other crystalline piezoelectric material.

The electrical connections ET for the external contacts are preferably arranged on the top side of the second wafer WF2 and connected to the second component structures by means of plated through-holes DK2. Further plated through-holes DK1 are connected to pillars PI, via which contact is established with the first component structures BES1 on the top side of the first wafer.

The number of plated through-holes required depends on the structure and function of the corresponding component structures BES1, BES2. On the outwardly facing top side of the second wafer WF2, different plated through-holes and the component structures connected thereto can be electrically connected to one another and led to common electrical connections ET.

The electrical connections ET can be connected by means of bumps BU, for example, to the outside world and in particular to a circuit environment. The bumps BU can be embodied as solder balls or else as stud bumps. In the region of the bumps BU, a solder-wetting under-bump metallization UBM is arranged on the electrical connections, and its geometry determines the area wetted with solder in the case of solder ball bumps after the melting thereof.

Figure 2:
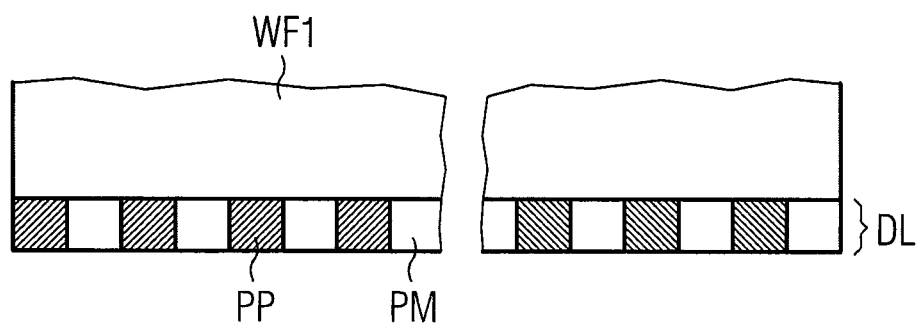
FIG. 2 shows a wafer with a damping layer.

FIG. 2 shows the underside of the first wafer WF1 in schematic cross section, said underside being provided with a damping layer DL for bulk waves in this embodiment. In the case of SAW components (Surface Acoustic Wave), the damping layer DL serves to damp disturbing bulk acoustic waves or to prevent reflection at the underside of the first wafer. For this purpose, the damping layer comprises a pattern PP of pillars, which is embodied in an irregular manner. For better producibility and further processability, the pattern of pillars PP is embedded into a polymer matrix PM, such that the damping layer has an approximately planar surface.

Figure 3:
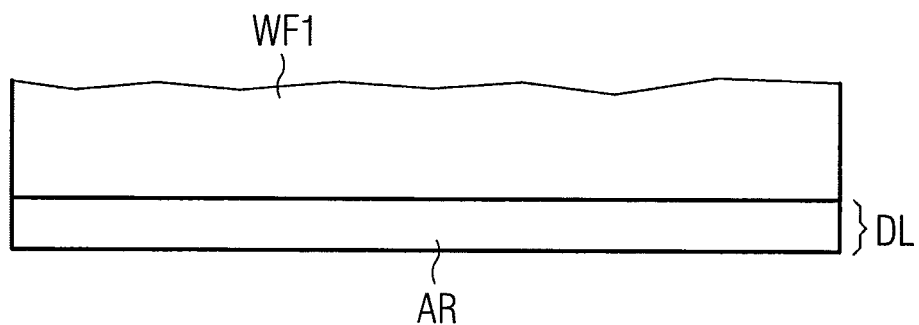
FIG. 3 shows a wafer with a variant of a damping layer.

FIG. 3 shows, in schematic cross section, a further embodiment of a possible damping layer DL, which is embodied here as an antireflection layer AR. While the pattern of pillars leads rather to a scattering of the bulk wave, the antireflection layer AR prevents the reflection of the bulk wave at that side of the first wafer WF1 which is covered with the antireflection layer by destructive superimposition of the wave reflected at front side and rear side of the antireflection layer. For this purpose, the antireflection layer comprises a material whose acoustic impedance differs from that of the first wafer WF1. The thickness of the antireflection layer is preferably dimensioned at approximately a quarter of the wavelength of the bulk acoustic wave in the antireflection layer, the angle of incidence of the bulk wave being taken into account. For an antireflection layer AR, metal layers such as, e.g., silver with a thickness of approximately 0.52 µm are suitable for a 2 GHz filter.

Figure 4:
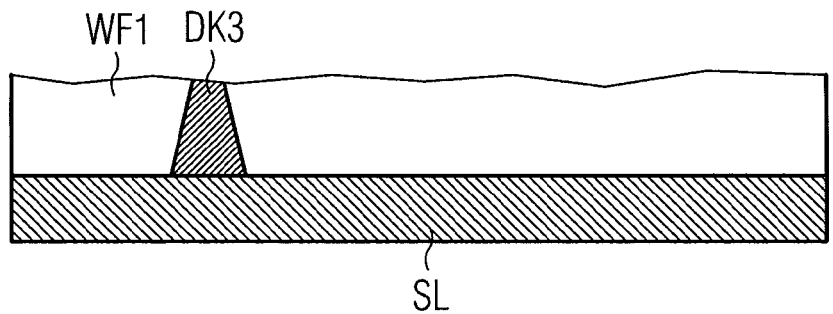
FIG. 4 shows a shielding layer with electrical contact-making.
Figure 5:
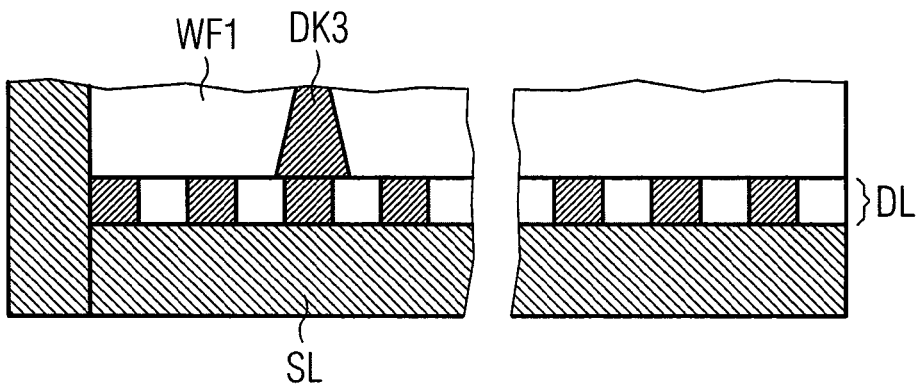
FIG. 5 shows a wafer with a damping layer and a shielding layer, which are electrically connected.
Figure 6:
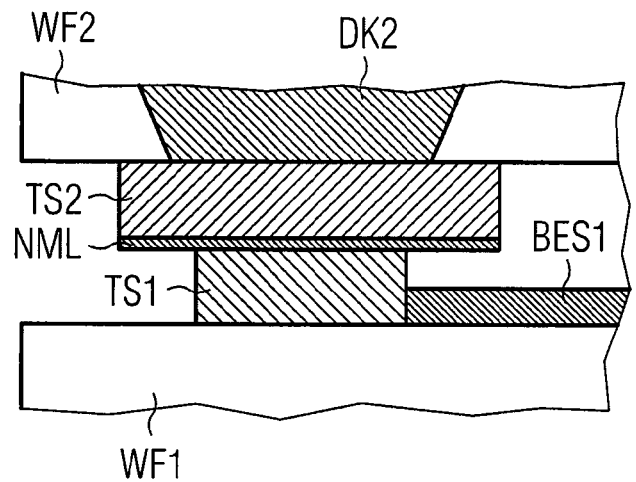
FIG. 6 shows a metallic structure connecting two wafers to one another.

FIG. 4 shows a downwardly facing top side of the first wafer WF1, said top side being provided with a shielding layer SL in this embodiment. Said shielding layer comprises a sufficient layer thickness of a metal. The shielding layer prevents electromagnetic interactions of the component structures in the package with the outside world, such that neither disturbances of the component in the package by the outside world nor disturbances of the environment by the component structures can take place. As illustrated in FIG. 4, the shielding layer SL is either directly connected electrically to the opposite top side of the first wafer WF1 via plated through-holes DK3, or it is connected indirectly via further structures to an external connection on the outwardly facing top side of the second wafer WF2.

A plated through-hole DK1 that leads through the first wafer WF1 and is connected to a metallization at the underside of said first wafer can also be used together with the metallization as a heat sink. In this case, it is also possible to lead a plurality of plated through-holes DK1 in close proximity to one another. A heat sink can then be used to dissipate heat from a hot spot in the active filter structure. Subsequently the two wafers with the two sides to be connected are fitted one above the other such that the partial structures corresponding to one another lie on one another. Subsequently, the two wafers are heated, aligned relative to one another and heated further up to the temperature at which the nano-metal particles sinter, or at which the corresponding connecting process dependent on the connecting layer takes place. Nano-metal particles composed of silver can be sintered, for example, at temperatures of between 100° and 200° C., while the melting point of solid silver is at 961° C.

After sintering, the nanostructure disappears, and so the melting point of the nano-metal particle layer applied by sintering automatically approaches that of solid silver and is significantly higher. That means that the two partial structures, with the aid of the sintered nano-metal particles in the connecting layer, are thermally stable far beyond the temperatures that occur during the soldering in or unsoldering of the later component.

Figure 7A:
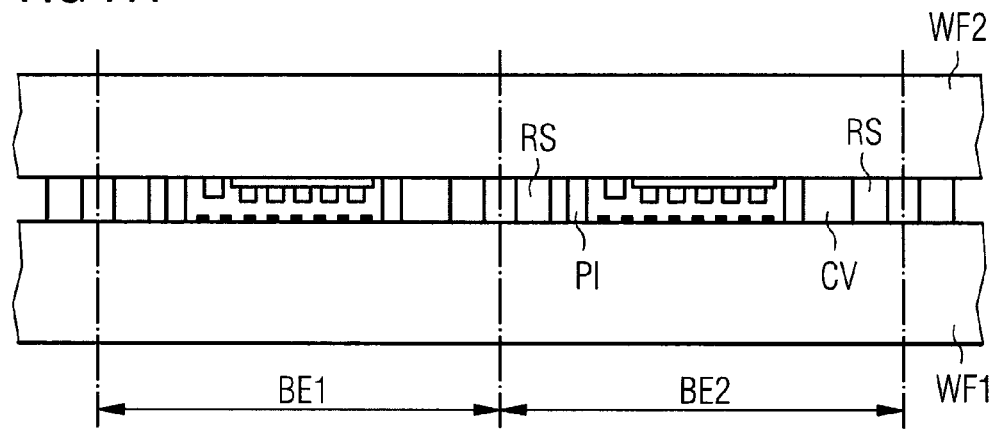
FIGS. 7A to 7F show different method stages in the production of external connections and plated through-holes.

After wafer bonding, in which the metallic partial structures for frame structure, pillars PI and pillar-type supporting structures are connected to one another, the arrangement illustrated in FIG. 7A is obtained, which represents a wafer assemblage as first and second wafers. The excerpt shown comprises component structures for a total of two components, which are in each case surrounded per se by a closed frame structure RS. After wafer bonding, the first and second component structures BES are additionally enclosed in a cavity CV.

The component structures BES illustrated are associated with two separate components BE1 and BE2, which are only singulated in a later method stage.

Since the stability of the wafer assemblage is increased compared with that of an individual wafer, the thickness of one or both wafers can now be reduced. A grinding method is preferably used for this purpose.

In the next step, holes VI for the later plated through-holes are produced in the outwardly facing surface of the thinned wafer, here of the second wafer WF2. A laser ablation method operating with pulsed ps lasers of suitable wavelength is suitable for this purpose, for example. Their wavelengths can be in the range of 500 to 600 nm or in the range of 250 to 400 nm.

The ablation method has the effect that holes having a conical cross section arise without further assistance. A preferred angle of inclination of the holes is achieved if the upper entrance opening has a diameter that is less than the thickness of the thinned wafer, and the opening at the opposite end has a diameter in the region of half the layer thickness of the thinned wafer, or less than that. A sufficient layer thickness of the thinned wafer is, for example, 70 µm for piezoelectric materials such as lithium tantalate, lithium niobate and quartz.

The holes for the plated through-holes are produced at the locations in which on the inner surface of the drilled wafer WF2 they meet a pad PD or some other metallic area, which can be part of the corresponding component structure BES2. Although the selectivity between wafer material and metallization is only low compared with a laser ablation method using ps lasers, the transition between the materials can nevertheless be used for end point identification of the laser ablation method. For this purpose, a spectral line of the material lifted off by the laser can be observed. Thus, either the vanishing of a typical spectral line for the wafer material can be observed and determined as the end point, or the occurrence of a spectral line of the metallization can be employed for this purpose.

Figure 7B:
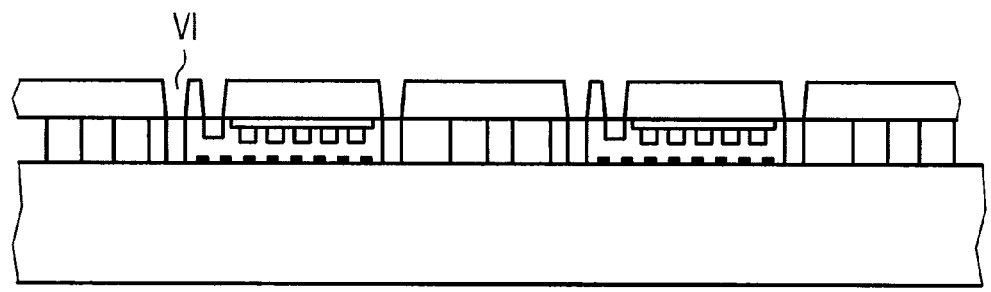

FIG. 7B shows that provision is then made firstly of holes VI for making contact with pillars PI and for pads PD, in total in at least the same number as external electrical connection areas with which contact has to be made. At least one further hole VI can be produced for making contact with the frame structure.

After the drilling of the holes, a base metallization ML1 is produced over the entire surface of the first wafer WF1.

Figure 7C:
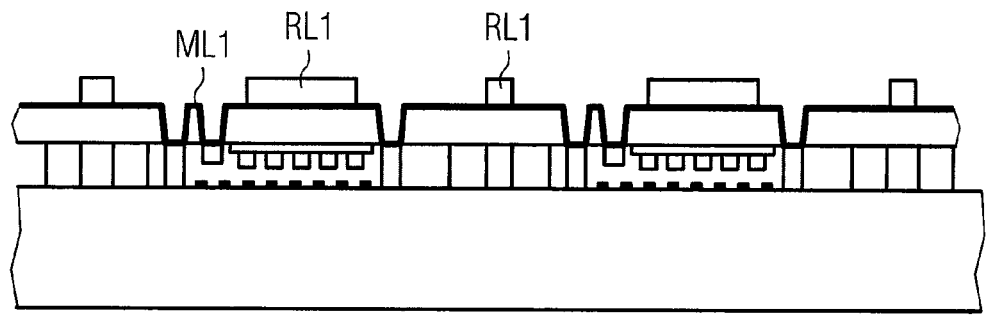

Subsequently, those areas which later are intended to be free of metal are covered with a first structured polymer layer RL1. The polymer layer RL1 can be applied by stencil printing or by a jet printing method. The polymer serves as an etching resist for the base metallization applied by sputtering over a large area. FIG. 7C shows the arrangement at this method stage.

Figure 7D:
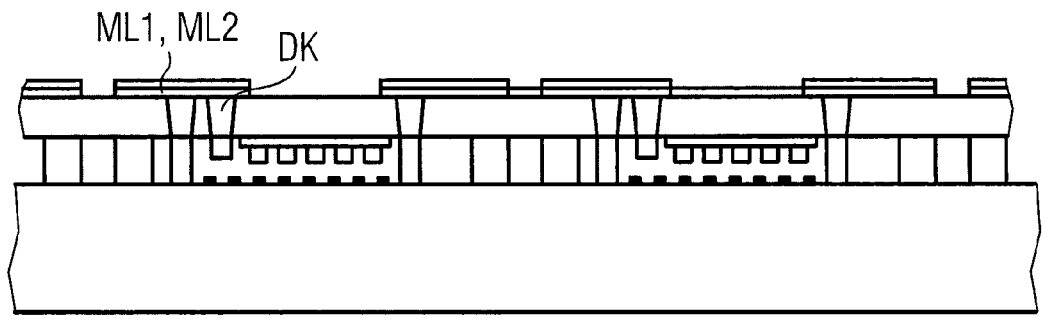

As shown by FIG. 7D, in the next step, if necessary, over the base metallization a further metal layer ML2 as reinforcement layer for the base metallization ML1 is produced at the areas not covered by the first structured polymer layer RL1, in particular by means of an electrolytic or electroless method. Copper is suitable as metal for the reinforcement step ML2. The copper can finally be coated with a further metal layer, for example, a nickel layer.

The metallic reinforcement layer ML2 can be produced with a thickness such that in this case the holes VI provided for the plated through-holes become overgrown completely with metal and thus produce completely filled plated through-holes DK.

FIG. 7D shows the arrangement after the removal of the first resist structure RL1 and the underlying layer of the base metallization ML1. On account of the relatively small layer thickness thereof, no further etching mask is required for removing the base metallization.

In the next step, a wetting layer UBM is produced on the connection areas ET, which wetting layer firstly provides for a good adhesion of the bumps on the connection area ET and secondly actually ensures in the first place that the metal area provided for the bump can be wetted with the bump.

Subsequently, bumps BU are produced or preformed over all areas which are provided for contact-making and are provided with a wetting layer UBM. This can be effected by means of soldering paste printing and a subsequent reflow process. However, it is also possible to apply the bumps by means of a liquid solder jet printing method.

Figure 7E:
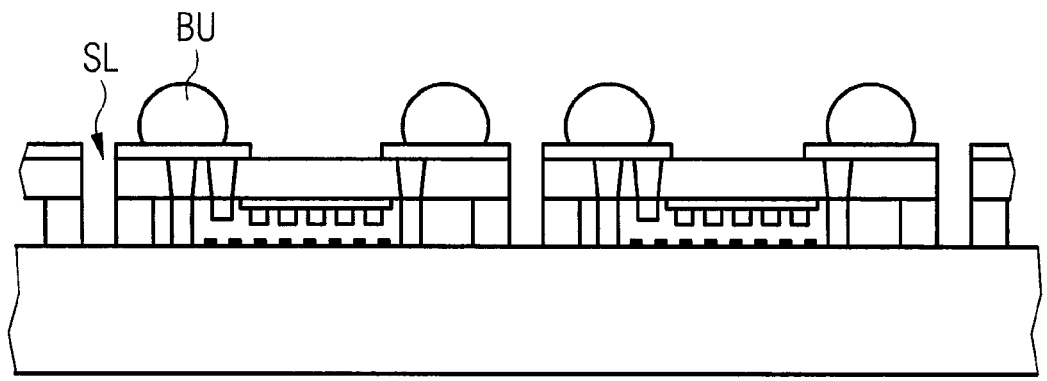

In the next step, the components are singulated. For this purpose, firstly along sawing lines SL a first step can be made through the upper second wafer WF2 as far as the surface of the first wafer. In this case, the sawing line SL is led between two adjacent frame structures RS. FIG. 7E shows the arrangement at this method stage.

Figure 7F:
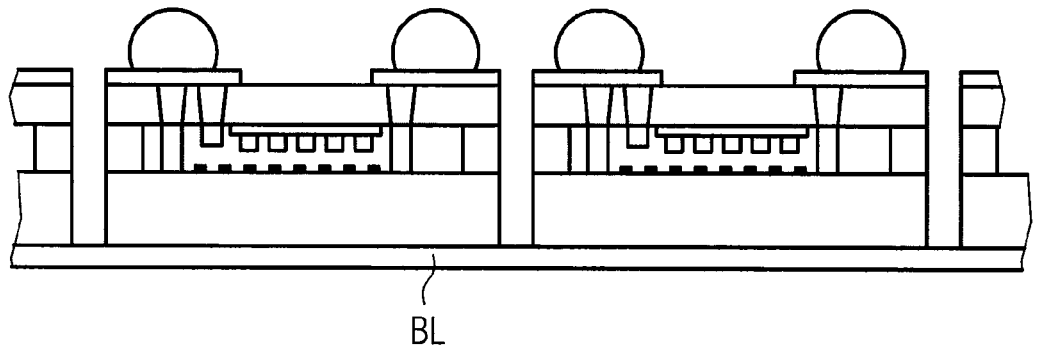

The first wafer WF1 is then sawn further from the top through the sawing track of the second wafer WF2 to at least approximately its final thickness. The first wafer is then thinned from its rear side to the sawing cut, such that the individual components arise in this way. This is shown in FIG. 7F.

However, it is also possible for this residual layer thickness that still keeps the wafer assembly together to be sawn through by means of a second sawing step from the underside.

Furthermore, it is possible to make the sawing cut through both wafers if the first wafer has been thinned beforehand.

FIG. 8 shows, on the basis of schematic cross sections, an alternative possibility for producing the metallizations for connecting lines, connection areas and the wetting layer at the surface of the second wafer WF2. A base metallization ML1 is produced (see FIG. 8A) over the entire surface of the second wafer WF2 after the drilling of the holes VI (as in FIG. 7B). A sputtering method, for example, is suitable for this purpose. The base metallization can comprise a thin adhesion layer comprising, for example, 50 to 100 nm of titanium. An electrically conductive layer, for example, 2-5 µm of copper, is likewise sputtered thereover. The base metallization ML1 also covers the inner sides of the holes VI and thus also has contact with the metallization exposed at the bottom of the holes VI in the interior of the cavity CV on the underside of the second wafer.

However, it is also possible for the base metallization to be applied by some other method suitable for layer production, for example, applied by vapor deposition, or for instance, printed by means of a jet printing method.

Figure 8A:
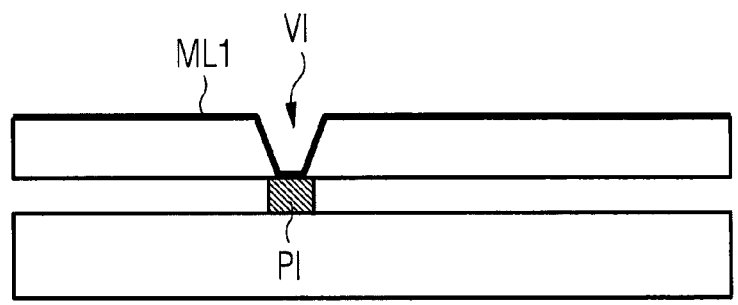
FIGS. 8A to 8E show different method stages in the production of a metallization for external contacts and plated through-holes.
Figure 8B:
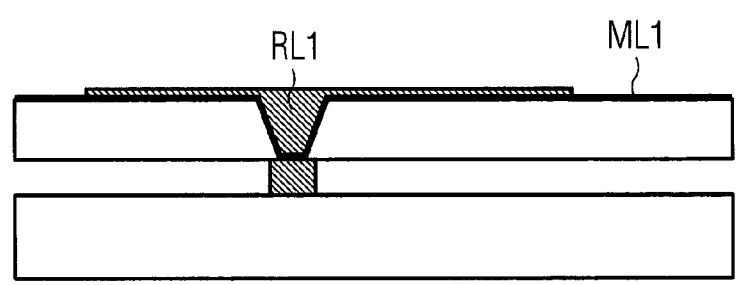

Subsequently, those areas which later constitute the electrical connections to the bumps are covered with a structured polymer layer RL1. The polymer layer RL1 can be applied by stencil printing or by a jet printing method. The polymer serves as an etching resist for the base metallization applied by sputtering over a large area. FIG. 8B shows the arrangement at this method stage.

Figure 8C:
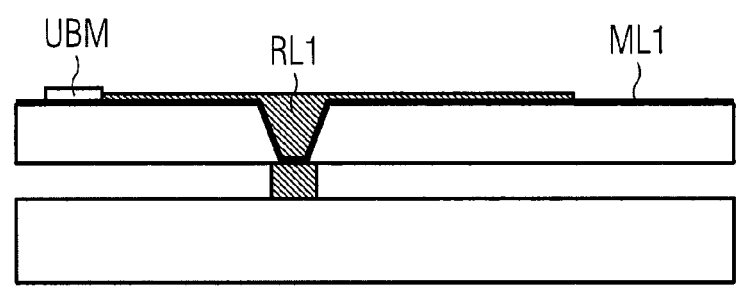

As shown in FIG. 8C, in the next step, a wetting layer UBM is produced at the locations on which the bumps are seated later. This can again be effected by jet printing of, for example, gold nano-metal particles. This is subsequently followed by thermal curing of the polymer and sintering of the nano-metal particles.

Figure 8D:
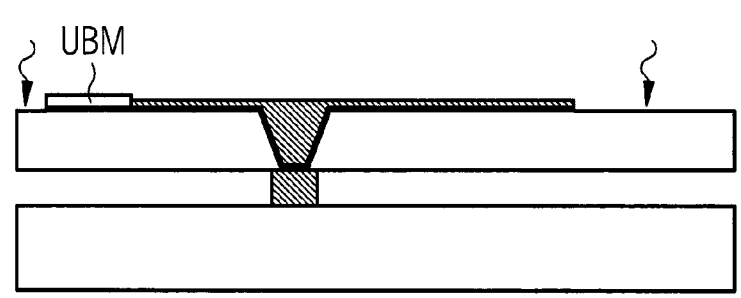

The base metallization ML1 is then etched away at the locations not covered by polymer or by the wetting layer UBM. FIG. 8D shows the arrangement at this method stage.

Figure 8E:
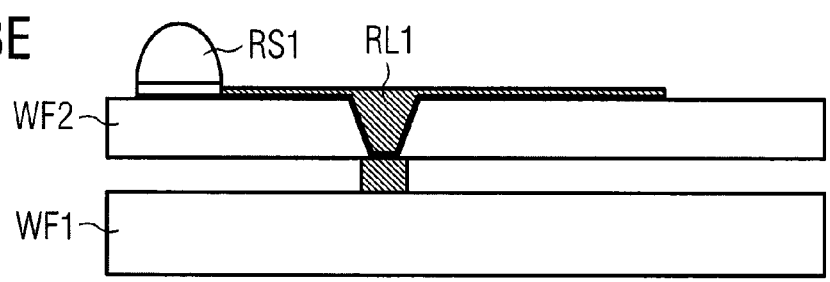

As shown in FIG. 8E, subsequently, bumps BU are produced or preformed over all areas which are provided for contact-making and are provided with a wetting layer UBM. This can be effected by means of soldering paste printing and a subsequent reflow process. However, it is also possible to apply the bumps by means of a liquid solder jet printing method.

In a variant not illustrated in the figures, all metallizations ML1, ML2 on the surface of the second wafer can also be produced directly by using a structuring application method. For this purpose, it is appropriate to produce the metallizations in the desired structure by printing nano-metal particles by means of a jet printing method or by printing a conductive adhesive. In the next step, the wetting layers UBM are then produced, for example, in a structured manner by a printing method by means of jet printing. If appropriate, the wetting layers UBM can also be provided with a diffusion barrier layer. Likewise alternatively, all directly produced metallizations can also be reinforced in an electroless manner or electrolytically.

Figure 9A:
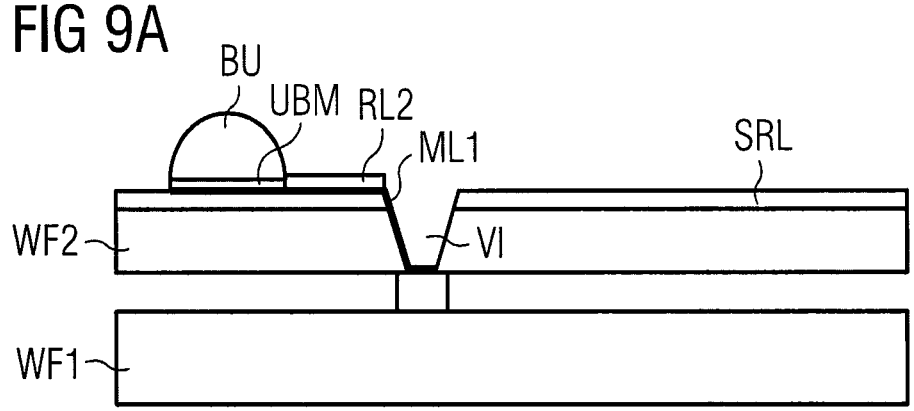
FIGS. 9A to 9C show different method stages in a further variant of the production of metallizations for external contacts and plated through-holes.

FIG. 9A shows a further variant on the basis of schematic cross sections, with which further variant the thermal cycling stability of the wafer-level package according to the invention can be improved. For this purpose, a stress reduction layer SRL is applied between second wafer and bump BU, and, on account of its elasticity or low modulus of elasticity, can absorb or reduce stresses that arise during the operation of the wafer-level package. In FIG. 9A, said stress reduction layer is applied as a layer over the whole area on the second wafer WF2. This application takes place before the holes are drilled. As a consequence, all metallizations on the top side of the second wafer are situated either in the drilled holes or on the surface of the stress reduction layer.

Figure 9B:
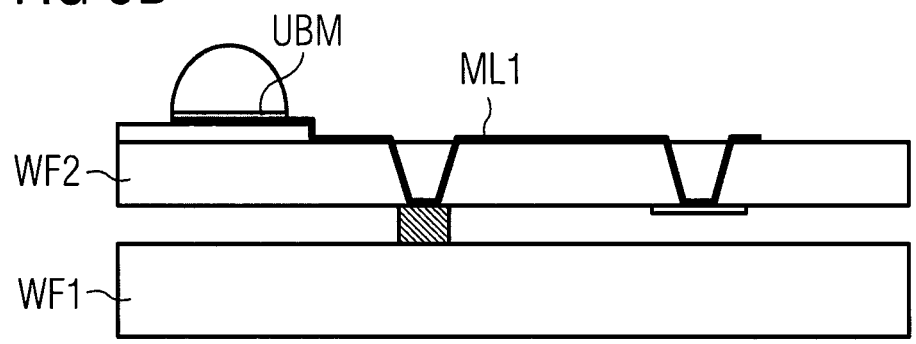

FIG. 9B shows a structured stress reduction layer as a further variant on the basis of a schematic cross section, which stress reduction layer was likewise preferably produced and structured before the drilling of the holes. In this variant, the metallizations are applied in the holes, on the surface of the second wafer and partly on the surface of the stress reduction layer.

The structured application of the stress reduction layer is possible, for example, by means of a printing method such as jet printing or stencil printing.

Figure 9C:
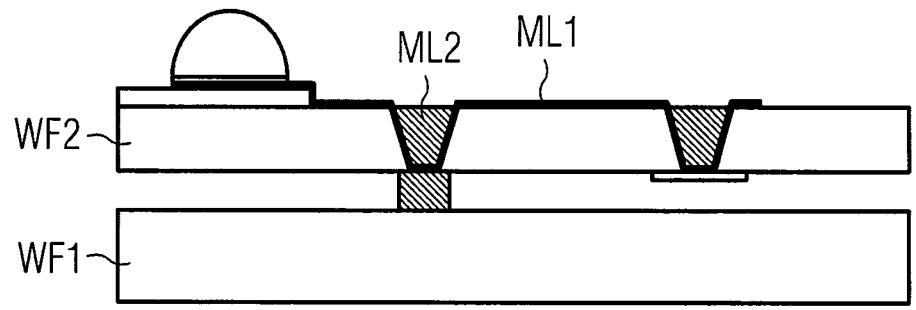

With the use of a stress reduction layer, too, it is possible to apply the metallizations as in FIG. 7 or 8 and, if appropriate, to produce them in two stages as base metallization and reinforcement layer, wherein the holes can also be completely filled by the reinforcement layer, as is illustrated for example in FIG. 9C.

Figure 10:
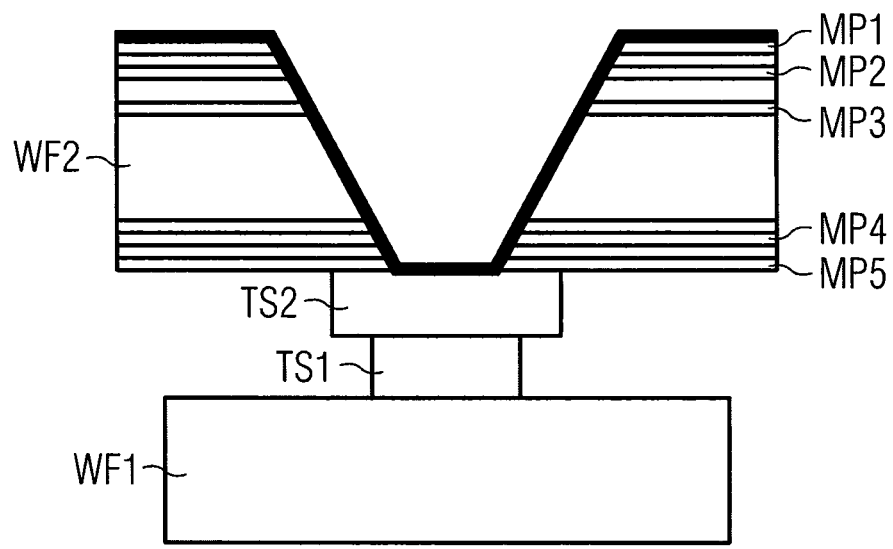
FIG. 10 shows a plated through-hole that interconnects different electrically conductive layers arranged one above another.

FIG. 10 shows, on the basis of a schematic cross section, a plated through-hole guided on a pillar PI or a frame structure RS. Said plated through-hole simultaneously cuts a plurality of conductive layers situated on or below the second wafer or applied on the top sides thereof and thus electrically conductively connects all these layers. In the exemplary embodiment illustrated, two metallically conductive layers MP4, MP5 are situated at the underside of the second wafer, said layers being separated from one another by insulating layers. Three metallically conductive layers MP1 to MP3 are situated on the top side, said layers likewise being separated from one another by insulating layers. In this way, the plated through-hole makes it possible to interconnect different conductor track planes realized in the metallically conductive layers MP on or below the second wafer WF2.

Figure 11:
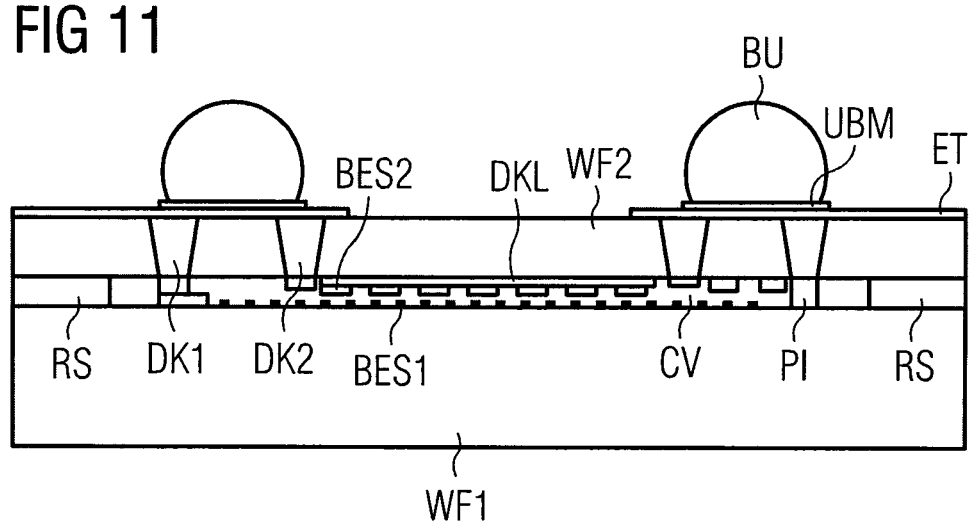
FIG. 11 shows a further wafer-level package, in which at least one but preferably both wafers consist of a piezoelectric material.
Figure 12A:
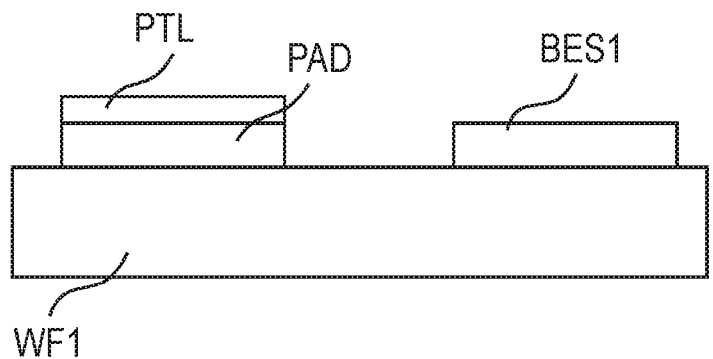
FIG. 12A shows a wafer $WF_1$ with component structures BEST applied on a surface thereof next to a pad PAD that is electrically connected thereto. On top of the pad PAD a pad-thickening layer PTL is applied.
Figure 12B:
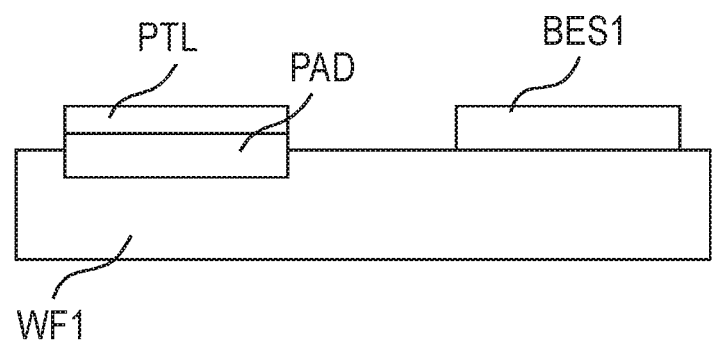
FIG. 12B shows a similar arrangement wherein the pad PAD is at least partly buried in the surface of the wafer $WF_1$ and covered with a pad-thickening layer PTL.
Figure 12C:
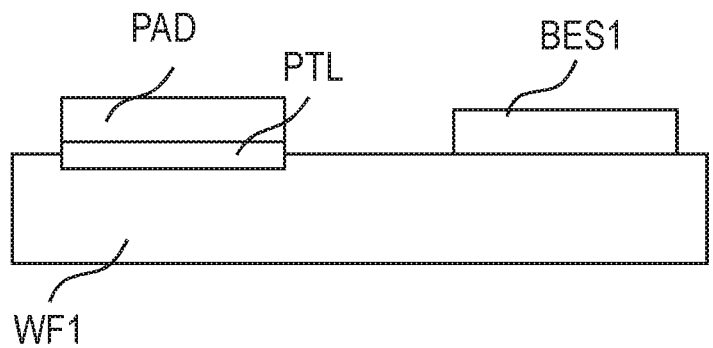
FIG. 12C shows a further similar arrangement wherein the pad-thickening layer PTL is buried at least partly in the surface of the wafer $WF_1$. The pad PAD is applied directly above the pad-thickening layer PTL.

FIG. 11 shows a further configuration of the wafer-level package according to the invention for the case where at least one but preferably both wafers consist of a piezoelectric material. If, as illustrated, a second component structure BES2 as coil is embodied on the surface of one of these two wafers, preferably on the inwardly facing surface of the second wafer WF2, then a metallization directly on the piezoelectric material, which can have a relatively high dielectric constant of approximately 40, leads to an only moderate electrical quality factor of the coil. In the variant illustrated, therefore, a decoupling layer DKL is applied between the surface of the wafer WF2 and the coil realized as component structure BES2. This is a dielectric layer having a low dielectric constant, for which both inorganic and polymer layers are suitable.

In a modification of FIG. 11, the coil can, of course, also be applied on the outwardly facing top side of one of the two wafers, preferably of the second wafer WF2, wherein in this case, too, the decoupling layer DKL is arranged between the coil metallization and the piezoelectric wafer WF2. The decoupling layer DKL is preferably restricted to the region of the coil and is therefore applied correspondingly in a structured manner.

The wafer-level package according to the invention is not restricted to the embodiments illustrated in the figures, which embodiments merely show individual concrete configurations of the more general concept. In particular, wafer-level packages according to the invention can differ in the number and shaping of the component structures, the plated through-holes and the bumps. Embodiments illustrated in different figures can also be combined at individual wafer-level packages, which then likewise constitute wafer-level packages according to the invention.

The invention claimed is:

1. A wafer-level package for an electrical component comprising:
    a first piezoelectric wafer comprising first component structures on a first surface;
    a second piezoelectric wafer comprising second component structures;
    a metallic frame structure connected to the first surface of the first wafer and a first surface of the second wafer such that a hermetically sealed cavity enclosed by the frame structure is formed between the first and second wafers;
    electrical connections on a second surface of the second wafer that faces away from the cavity;
    pillar-type electrical connections supported within the cavity on the first and second wafers and electrically connected to the first component structures and/or the second component structures;
    contact pads within the cavity on the first surface of the first wafer and the first surface of the second wafer;
    an irregular pattern of pillars arranged on a second surface of the first wafer, the second surface of the first wafer facing away from the first surface of the first wafer, wherein the irregular pattern of pillars is configured to dampen acoustic waves; and
    a shielding layer formed over the pillars,
    wherein the first component structures and the second component structures are enclosed within the cavity and are connected to the electrical connections via plated through-holes through the second wafer,
    wherein all the plated through-holes end either on the frame structure, on a pillar connection or on a contact pad, without violating a hermeticity of the cavity,
    wherein the frame structure, the pillar connections and the contact pads substantially consist of copper,
    wherein the first component structures operate with surface acoustic waves and are embodied as an SAW filter, and
    wherein the second component structures comprise transducers for surface acoustic waves and/or passive components selected from inductances and capacitances.

2. The wafer-level package according to claim 1, wherein the shielding layer is configured to electrically or electromagnetically shield the first and second component structures.

3. The wafer-level package according to claim 1, wherein the shielding layer comprises an Ni layer, and wherein the shielding layer is configured to electromagnetically shield the first and second component structures.

4. The wafer-level package according to claim 1, wherein the shielding layer is connected via a plated through-hole through the first wafer to the first or second component structures, the frame structure or the electrical connections at the second surface of the second wafer.

5. The wafer-level package according to claim 1, further comprising a damping layer for bulk waves, wherein the damping layer comprises the irregular pattern of the pillars, and wherein the damping layer comprises a thickness of a quarter wave ($\lambda/4$).

6. The wafer-level package according to claim 5, wherein the pillars of the damping layer comprises Ni pillars embedded into a polymer matrix.

7. The wafer-level package according to claim 1, further comprising a copper coil arranged on the first surface of the second wafer as one of the second component structures, wherein the copper coil is electrically conductively connected to the first component structures and/or the second component structures.

8. The wafer-level package according to claim 1, wherein the pillar connections, as seen in a vertical direction, in each case have two sections having a different cross-sectional area per section.

9. The wafer-level package according to claim 1,
    wherein the first wafer and/or the second wafer has transducers for surface acoustic waves as the component structures,
    wherein each transducer has interdigitally arranged comb electrodes with electrode fingers,
    wherein the electrode fingers of the comb electrodes are arranged at busbars and/or pads, and
    wherein the pads are provided with a thickening composed of electrolytically deposited copper, the thickening being arranged above the pads or below the pads as a structure buried into the first and/or the second wafer.

10. The wafer-level package according to claim 1, further comprising a stress reduction layer comprising a polymer arranged between the second surface of the second wafer and the electrical connections such that the stress reduction layer is located directly below the electrical connections.

11. The wafer-level package according to claim 1, wherein the first and second piezoelectric wafers essentially consist of the same monocrystalline piezoelectric material, or constitute a combination of a wafer composed of lithium tantalate, lithium niobate or a wafer composed of quartz.

12. A wafer-level package for an electrical component comprising:
    a first piezoelectric wafer comprising first component structures on a first surface;
    a second piezoelectric wafer comprising second component structures;
    a metallic frame structure connected to the first surface of the first wafer and a first surface of the second wafer such that a hermetically sealed cavity enclosed by the frame structure is formed between the first and second wafers;

electrical connections on a second surface of the second wafer that faces away from the cavity;

pillar-type electrical connections supported within the cavity on the first and second wafers and electrically connected to the first component structures and/or the second component structures;

contact pads within the cavity on the first surface of the first wafer and the first surface of the second wafer; and a damping layer for bulk waves located on a second surface of the first wafer, the damping layer comprising a thickness of a quarter wave (λ/4), wherein the damping layer comprises an irregular pattern of pillars, wherein the pillars comprise Ni pillars embedded in a polymer matrix, wherein the first component structures and the second component structures are enclosed within the cavity and are connected to the electrical connections via plated through-holes through the second wafer, wherein all the plated through-holes end either on the frame structure, on a pillar connection or on a contact pad, without violating a hermeticity of the cavity, wherein the frame structure, the pillar connections and the contact pads substantially consist of copper, wherein the first component structures operate with surface acoustic waves and are embodied as an SAW filter, and wherein the second component structures comprise transducers for surface acoustic waves and/or passive components selected from inductances and capacitances.

13. The wafer-level package according to claim 12, wherein a copper coil is arranged on the first surface of the second wafer as one of the second component structures and is electrically conductively connected to the first component structures and/or the second component structures.

14. The wafer-level package according to claim 12,
wherein the first wafer and/or the second wafer has transducers for surface acoustic waves as the component structures,
wherein each transducer has interdigitally arranged comb electrodes with electrode fingers,
wherein the electrode fingers of the comb electrodes are arranged at busbars and/or pads, and
wherein the pads are provided with a thickening composed of electrolytically deposited copper, the thickening being arranged above the pads or below the pads as a structure buried into the first and/or the second wafer.

15. The wafer-level package according to claim 12, further comprising a stress reduction layer comprising a polymer arranged between the second surface of the second wafer and the electrical connections such that the stress reduction layer is located directly below the electrical connections.

* * * * *